United States Patent
Tadatomo et al.

(10) Patent No.: US 7,504,324 B2
(45) Date of Patent: Mar. 17, 2009

(54) SEMICONDUCTOR BASE AND ITS MANUFACTURING METHOD, AND SEMICONDUCTOR CRYSTAL MANUFACTURING METHOD

(75) Inventors: Kazuyuki Tadatomo, Itami (JP); Hiroaki Okagawa, Itami (JP); Yoichiro Ouchi, Itami (JP); Masahiro Koto, Itami (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 11/529,905

(22) Filed: Sep. 29, 2006

(65) Prior Publication Data

US 2007/0026643 A1 Feb. 1, 2007

Related U.S. Application Data

(60) Continuation of application No. 10/842,777, filed on May 11, 2004, now Pat. No. 7,115,486, which is a division of application No. 09/936,683, filed as application No. PCT/JP00/01588 on Mar. 15, 2000, now Pat. No. 6,940,098.

(30) Foreign Application Priority Data

| Mar. 17, 1999 | (JP) | ............................... 1999-72133 |
| Nov. 26, 1999 | (JP) | ............................ 1999-335591 |
| Nov. 26, 1999 | (JP) | ............................ 1999-336421 |
| Dec. 13, 1999 | (JP) | ............................ 1999-353044 |

(51) Int. Cl.
*H01L 21/20* (2006.01)
*H01L 21/36* (2006.01)

(52) U.S. Cl. ...................... 438/481; 438/488; 438/492; 438/503; 257/E21.09; 257/E21.566

(58) Field of Classification Search ................ 438/487, 438/481, 341, 478, 179, 488, 490, 492, 503; 257/E21.09, E21.566; 117/95, 103, 104, 117/913, 815, 923, 952

See application file for complete search history.

(56) References Cited

U.S. PATENT DOCUMENTS

| 5,279,701 A | 1/1994 | Shigeta et al. |
| 5,614,019 A | 3/1997 | Vichr et al. |
| 5,673,092 A | 9/1997 | Horie et al. |
| 5,676,752 A | 10/1997 | Bozler et al. |
| 5,727,015 A | 3/1998 | Takahashi et al. |
| 6,091,085 A | 7/2000 | Lester |
| 6,156,581 A | 12/2000 | Vaudo et al. |
| 6,225,650 B1 | 5/2001 | Tadatomo et al. |
| 6,252,261 B1 * | 6/2001 | Usui et al. .................. 257/190 |
| 6,258,617 B1 | 7/2001 | Nitta et al. |
| 6,274,518 B1 | 8/2001 | Yuri et al. |
| 6,303,405 B1 | 10/2001 | Yoshida et al. |
| 6,335,546 B1 | 1/2002 | Tsuda et al. |
| 6,403,451 B1 * | 6/2002 | Linthicum et al. .......... 438/479 |
| 6,426,519 B1 | 7/2002 | Asai et al. |
| 6,582,986 B2 | 6/2003 | Kong et al. |
| 6,617,182 B2 | 9/2003 | Ishida et al. |
| 6,979,584 B2 * | 12/2005 | Koike et al. ................... 438/44 |
| 2004/0048471 A1 | 3/2004 | Okagawa et al. |

FOREIGN PATENT DOCUMENTS

| EP | 0 874 405 A2 | 10/1998 |
| JP | 04-236478 A | 8/1992 |
| JP | 05-267175 A | 10/1993 |
| JP | 09-219561 A | 8/1997 |
| JP | 09-312418 A | 12/1997 |
| JP | 09-326534 A | 12/1997 |
| JP | 10-107317 A | 4/1998 |
| JP | 10-178026 A | 6/1998 |
| JP | 10-284507 A | 10/1998 |
| JP | 2000-101139 | 4/2000 |
| JP | 2000-106455 A | 4/2000 |
| JP | 2000-156524 A | 6/2000 |
| JP | 2000-357663 A | 12/2000 |

OTHER PUBLICATIONS

Zheleva et al., "Pendeo-Epitaxy—A New Approach for Lateral Growth of GaN Structures," *MRS Internet Journal of Nitride Semi-*

*conductor Research*, Materials Research Society, Warrendale, Pennsylvania, *4S1*, G3.38 (1999) (also presented at "1998 Fall Meeting of the Materials Research Society held in Boston, Massachusetts, Nov. 30-Dec. 4").

\* cited by examiner

*Primary Examiner*—Michelle Estrada
*Assistant Examiner*—Quovaunda Jefferson
(74) *Attorney, Agent, or Firm*—Leydig, Voit & Mayer, Ltd.

(57) ABSTRACT

A growth plane of substrate 1 is processed to have a concavo-convex surface. The bottom of the concave part may be masked. When a crystal is grown by vapor phase growth using this substrate, an ingredient gas does not sufficiently reach the inside of a concave part 12, and therefore, a crystal growth occurs only from an upper part of a convex part 11. As shown in FIG. 1(*b*), therefore, a crystal unit 20 occurs when the crystal growth is started, and as the crystal growth proceeds, films grown in the lateral direction from the upper part of the convex part 11 as a starting point are connected to cover the concavo-convex surface of the substrate 1, leaving a cavity 13 in the concave part, as shown in FIG. 1(*c*), thereby giving a crystal layer 2, whereby the semiconductor base of the present invention is obtained. In this case, the part grown in the lateral direction, or the upper part of the concave part 12 has a low dislocation region and the crystal layer prepared has high quality. The manufacturing method of the semiconductor crystal of the present invention divides this semiconductor base into the substrate 1 and the crystal layer 2 at the cavity part thereof to give a semiconductor crystal.

8 Claims, 10 Drawing Sheets

(a)

(b)

(c)

(a)

(b)

(c)

(d)

(a)

(b)

(c)

(d)

(a)

(b)

(c)

removal of sapphire substrate + pre-semiconductor crystal

SEMICONDUCTOR BASE AND ITS MANUFACTURING METHOD, AND SEMICONDUCTOR CRYSTAL MANUFACTURING METHOD

CROSS-REFERENCE TO RELATED APPLICATIONS

This patent application is a continuation of U.S. patent application Ser. No. 10/842,777, filed on May 11, 2004, and issued as U.S. Pat. No. 7,115,486, which is a divisional of U.S. patent application Ser. No. 09/936,683, filed on Nov. 30, 2001, and issued as U.S. Pat. No. 6,940,098, which is the U.S. national phase of International Patent Application No. PCT/JP00/01588, which designates the U.S. and was filed on Mar. 15, 2000.

TECHNICAL FIELD

The present invention relates to a semiconductor base, a semiconductor crystal and a manufacture method thereof. More particularly, this invention relates to a structure and a method useful when using a semiconductor material susceptible to dislocation defects.

BACKGROUND ART

For crystal growth of a GaN group material, a substrate free of lattice match, such as sapphire, SiC, Spinel, recently Si and the like, is used, because there is no substrate that lattice matches with GaN group materials. However, a manufactured GaN film contains dislocations amounting to $10^{10}$ dislocations/cm$^2$ due to the absence of lattice match. While high luminance light emitting diodes, semiconductor lasers and the like have been realized in recent years, reduction of a dislocation density is desired for achieving improved properties.

To avoid defects, such as dislocation and the like, caused by different lattice constant and the like, the same crystal as the material to be crystal grown is used. For example, for crystal growth of a GaN group semiconductor, a GaN substrate is used. However, a large-sized product has not been obtained, and therefore, sapphire and the like are actually used as a substrate. There has been proposed a method in recent years, wherein, for vapor phase growth on a GaN base layer grown on sapphire, the aforementioned base layer is partially masked to effect a selective growth for crystal growth in a lateral direction, whereby a high quality crystal having a reduced dislocation density is obtained (e.g., JP-A-10-312971). By growing this film thick and separating and removing the substrate, a GaN crystal can be obtained. Due to the problem of occurrence of cracks and breakage of substrate resulting from differences in lattice constant and in thermal expansion coefficient, a substrate having a large area has not been obtained.

The above-mentioned JP-A-10-312971 discloses a method for obtaining a film having a reduced dislocation density. However, a new problem has been found that, in the part grown in a lateral direction on a mask layer, the C axis tilts in a slight amount toward the direction of lateral growth, and degrades the crystal quality (Abstracts of MRS 1998 Fall Meeting G3.1). This can be confirmed through measurement (ϕ scan) of the incident orientation dependency of X-ray rocking curve measurement (XRC). That is, a full width at half-maximum (FWHM) of X-ray rocking curve by incident X-ray from the direction of lateral growth is greater than the FWHM value by X-ray from a stripe direction of a mask layer, which means the presence of orientation dependency of the micro tilting of the C axis. This suggests a possibility of inducing a number of new defects in the junction part of the lateral growth on the mask.

As the mask-layer material, SiO$_2$ is generally used. A problem has been clarified that, when a layer is laminated thereon by crystal growth, the Si component transfers into the crystal growth layer, constituting a problem of autodoping contamination.

When a semiconductor material containing Al, such as AlGaN, is grown on a substrate containing an SiO$_2$ mask layer, crystal growth occurs on the mask layer, too, preventing effective selective growth itself.

In an attempt to solve such a problem, a method has been proposed wherein a stripe groove processing is applied to a substrate having a buffer layer and a GaN layer formed on an SiC base substrate, which groove reaches the SiC layer to form a convex, and crystal growth is done from the GaN layer on the top of this convex (Abstracts of MRS 1998 Fall Meeting G3.38). According to this method, a selective growth without an SiO$_2$ mask layer is possible, whereby various problems caused by the use of the aforementioned SiO$_2$ mask can be overcome.

For the above-mentioned method, a sapphire substrate can be used as the base substrate and the method thereof has been disclosed (e.g., JP-A-11-191659). The above-mentioned method requires steps of crystal growing a buffer layer material and a GaN group material on a sapphire base substrate, taking the substrate out from a furnace for growth, applying a groove processing, and crystal growing again, thus posing a new inconvenience of complicated production process, increased number of steps, higher cost and the like.

An attempt has been also disclosed in the (Abstracts of the Japan Society of Applied Physics 99 autumn 2P-W-8) wherein a step is made on a GaN substrate and embedding growth is performed to secure a region having a low dislocation density. In this case, a low dislocation density region is formed in a part of the embedded layer.

To obtain a low dislocation density region by the above-mentioned method, however, the intervals between convex parts need to be widened or the depth of concave part needs to be increased. To this end, the layer needs to be grown thick by embedding for a long time, which in turn intrinsically poses various problems of occurrence of cracks due to the thick film forming, costly manufacture due to the long time spent, and the like.

There is also an attempt to crystal grow a GaN group material on an Si substrate. However, growth of a GaN group crystal results in cambers and cracks caused by difference in the thermal expansion coefficient, thereby preventing crystal growth having a high quality.

It is therefore an object of the present invention to avoid various problems caused by ELO growth using a conventional mask layer and achieve simplification of the production process, in view of the above-mentioned problems. The present invention also aims at solving the problems caused by the embedding growth of a step structure without a mask. In addition, the present invention aims at solving the problem of selective growth of AlGaN, which has been conventionally unattainable. The present invention further aims at suppressing the occurrence of cambers and cracks associated with the use of an Si substrate and the like.

In view of the above-mentioned problems, it is an object of the present invention to provide a GaN crystal having a large area. The present invention also aims at avoiding various problems caused by the ELO growth using a conventional mask layer and simplifying the production process.

DISCLOSURE OF THE INVENTION

The semiconductor base of the present invention comprises a substrate and a semiconductor crystal formed on the substrate by vapor phase growth, wherein the aforementioned substrate as a crystal growth plane has a concavo-convex surface and the aforementioned semiconductor crystal is crystal grown exclusively from an upper part of a convex part of the concavo-convex surface.

In this case, the above-mentioned semiconductor crystal is preferably InGaAlN.

It is preferable that the convex parts of the crystal growth plane of the above-mentioned substrate form parallel stripes.

It is more preferable that the above-mentioned semiconductor crystal be InGaAlN and the longitudinal direction of the stripe be in parallel to the (1-100) plane of the InGaAlN crystal.

A more specific semiconductor base of the present invention comprises a substrate and a semiconductor crystal formed on the substrate by vapor phase growth, wherein the aforementioned substrate has a concavo-convex surface as a crystal growth plane, the aforementioned semiconductor crystal is crystal grown exclusively from an upper part of a convex part of the concavo-convex surface, the aforementioned concavo-convex surface is covered with a semiconductor crystal grown, and a cavity is formed between the semiconductor crystal layer and the concave part of the aforementioned concavo-convex surface.

The concave part of the concavo-convex surface of the above-mentioned substrate is covered with a mask on which the crystal cannot substantially grow, and the above-mentioned semiconductor crystal may be crystal grown exclusively from an upper part of a convex part of the concavo-convex surface.

It is possible to employ a constitution of the semiconductor base, which comprises a first semiconductor crystal layer formed by making a crystal growth plane of a substrate a concavo-convex surface and crystal growing by vapor phase growth exclusively from an upper part of a convex part of the aforementioned concavo-convex surface, and a second semiconductor crystal layer formed by making a surface of the first semiconductor crystal layer a concavo-convex surface and similarly crystal growing exclusively from an upper part of a convex part thereof.

It is also possible to employ a constitution of the semiconductor base, which comprises a first semiconductor crystal layer formed by making a crystal growth plane of a substrate a concavo-convex surface, covering the concave part with a mask on which the crystal cannot substantially grow, and crystal growing by vapor phase growth exclusively from an upper part of a convex part of the aforementioned concavo-convex surface, and a second semiconductor crystal layer formed by making the surface of the first semiconductor crystal layer a concavo-convex surface, similarly covering the concave part with a mask on which the crystal cannot substantially grow and crystal growing exclusively from an upper part of the convex part thereof.

Moreover, a third semiconductor crystal layer obtained by making a surface of the second semiconductor crystal layer of the aforementioned semiconductor base a concavo-convex surface, and similarly vapor phase growing thereon, or plural semiconductor crystal layers formed in multiplicity by repeating similar steps, may be included.

In addition, a third semiconductor crystal layer obtained by making a surface of the second semiconductor crystal layer of the aforementioned semiconductor base a concavo-convex surface, covering a concave part with a mask on which the crystal cannot substantially grow, and similarly vapor phase growing thereon, or plural semiconductor crystal layers formed in multiplicity by repeating similar steps, may be included.

The manufacturing method of the semiconductor base of the present invention is characterized in that, for vapor phase growth of a semiconductor crystal on a substrate, a substrate surface is processed to give a concavo-convex surface in advance, an ingredient gas is supplied to the substrate, and the aforementioned concavo-convex surface of the substrate is covered with a semiconductor crystal formed by crystal growth exclusively from an upper part of a convex part of the aforementioned concavo-convex surface.

According to the above-mentioned manufacturing method, a concave part of the concavo-convex surface of the above-mentioned substrate may be covered with a mask on which the crystal cannot substantially grow, and an ingredient gas is supplied to the substrate, whereby the concavo-convex surface of the aforementioned substrate is covered with a semiconductor crystal formed by crystal growth exclusively from an upper part of a convex part of the aforementioned concavo-convex surface.

The manufacturing method of the semiconductor crystal of the present invention is characterized in that a crystal growth plane of the substrate is processed to have a concavo-convex surface and a semiconductor crystal is formed by vapor phase crystal growth from an upper part of a convex part of the concavo-convex surface to cover the concavo-convex surface, thereby giving a laminate having a cavity between the semiconductor crystal layer and the concave part of the aforementioned concavo-convex surface, and that the semiconductor crystal is separated from the substrate at the aforementioned cavity. In this case, the above-mentioned semiconductor crystal is preferably InGaAlN.

According to the manufacturing method of the semiconductor crystal of the present invention, a step for forming a semiconductor crystal as in the manufacturing method of the semiconductor base of the present invention may be repeated plural times. In addition, the concave part may be covered with a mask on which the crystal cannot substantially grow.

DETAILED DESCRIPTION OF THE INVENTION

Figure 1:
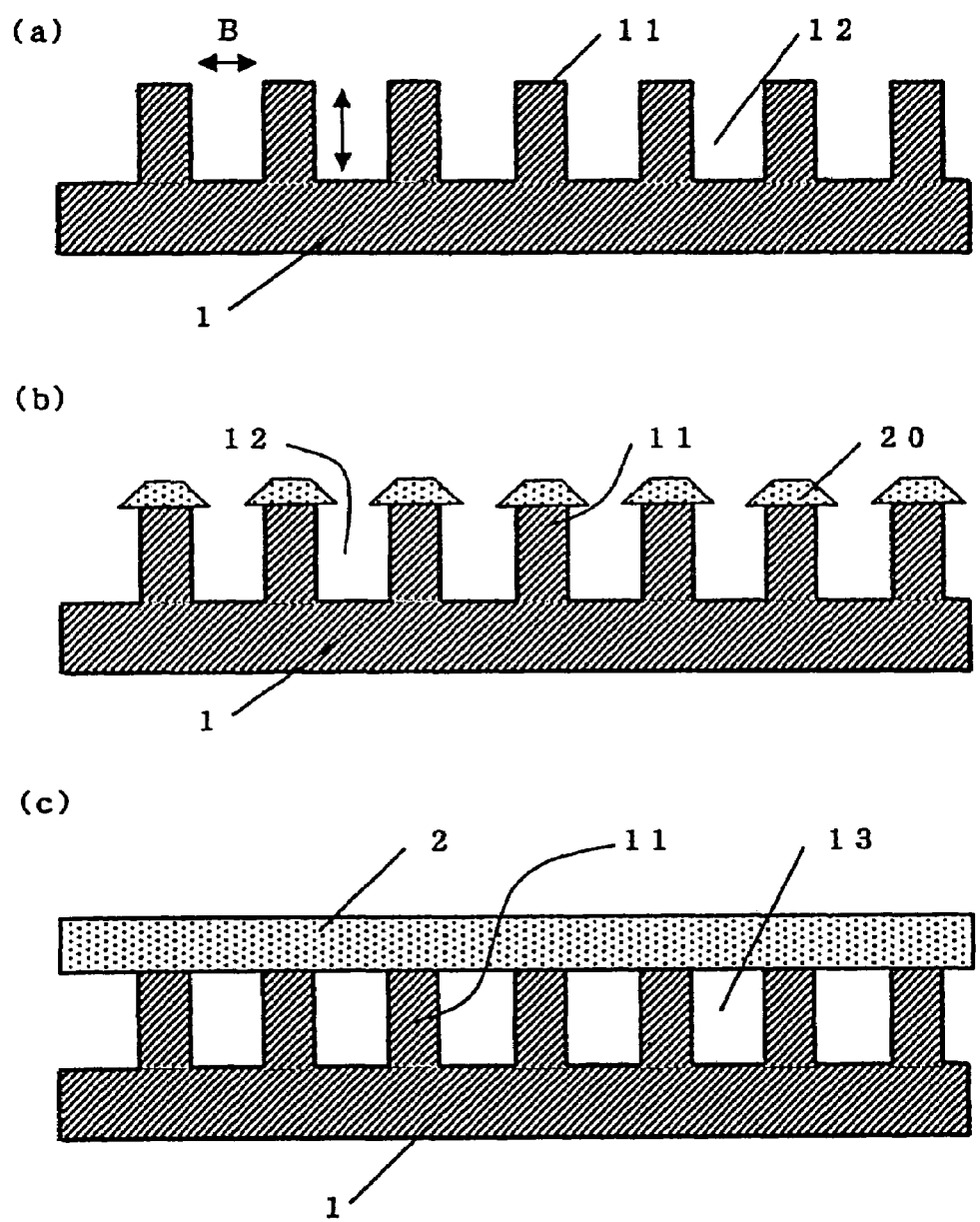
FIG. 1 is a sectional view explaining the state of crystal growth of the semiconductor base of the present invention, wherein 1 is a substrate, 11 is a convex part, 12 is a concave part, 13 is a cavity and 2 is a semiconductor crystal layer.

The present invention is characterized in that a substrate surface permitting lateral growth capable of substantially forming a low dislocation region is provided from the start of the crystal growth, by forming a concavo-convex surface on a substrate, on which even a buffer layer has not been formed. When the substrate is constituted in this way to allow vapor phase growth of crystals, the crystal growth can occur in the entirety of the substrate surface at the initial stage of growth. With the progress of the growth, the growth dominantly occurs in an upper part of a convex part, as a result of which diffusion of the starting material into the concave does not occur easily and the above-mentioned concavo-convex surface is covered with a layer grown exclusively from the upper part of the convex part. In the growth starting from the convex part, the growth in the perpendicular direction to the C axis (so-called lateral growth) occurs, thereby forming a substantially low dislocation region without using a mask layer, unlike the conventional manner. Therefore, by merely forming a concavo-convex surface on the substrate, successive growth is achieved by, for example, growing a buffer layer and then a GaN layer.

When a mask is formed on the bottom on the concave part, moreover, the growth in the concave part can be suppressed, which increases the efficiency of lateral growth, beneficially decreasing the thickness necessary for covering the concave part.

The manufacturing method of the semiconductor crystal of the present invention is first characterized by the growth of a semiconductor crystal by the same process as the manufacturing method of the above-mentioned semiconductor base. As mentioned above, the crystal growth in the concave part of the substrate can be suppressed, and therefore, a cavity is formed between the substrate and the semiconductor crystal. As a result, the contact area between the substrate and the semiconductor crystal can be decreased, which in turn markedly reduces the strain caused by the differences in the lattice constant and thermal expansion coefficient. This secondly characterizes the manufacturing method of the semiconductor crystal of the present invention. This has an effect that the occurrence of cracks and breakage can be suppressed and a semiconductor crystal having a large area can be obtained. In addition, because the above-mentioned strain focuses on the contact part between the substrate and the semiconductor crystal, the substrate and the semiconductor crystal can be separated efficiently.

The embodiment of the present invention is explained in detail in the following by referring to the drawings.

Figure 6:
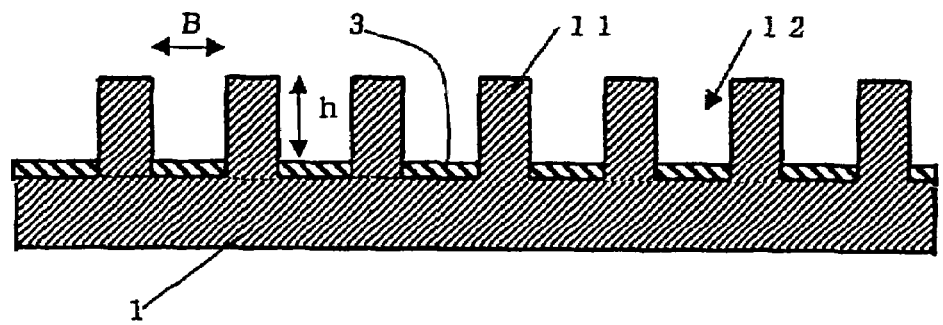
FIG. 6 is a sectional view explaining the state of crystal growth of the semiconductor base of the present invention and the manufacturing method of the semiconductor crystal of the present invention, wherein 3 is a mask.
Figure 6:
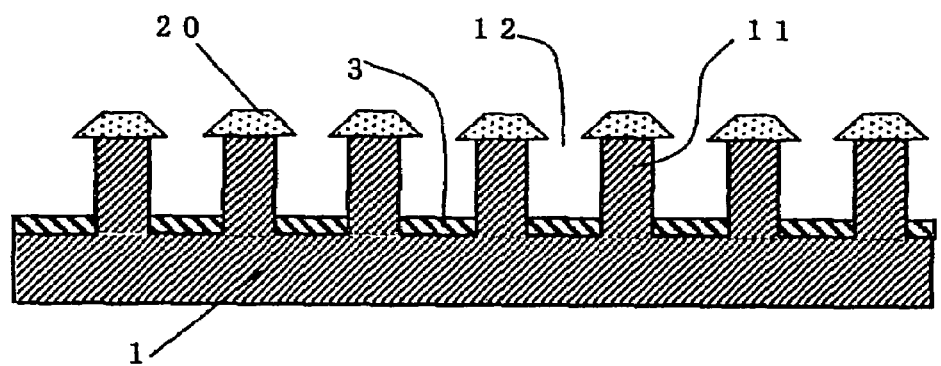
Figure 6:
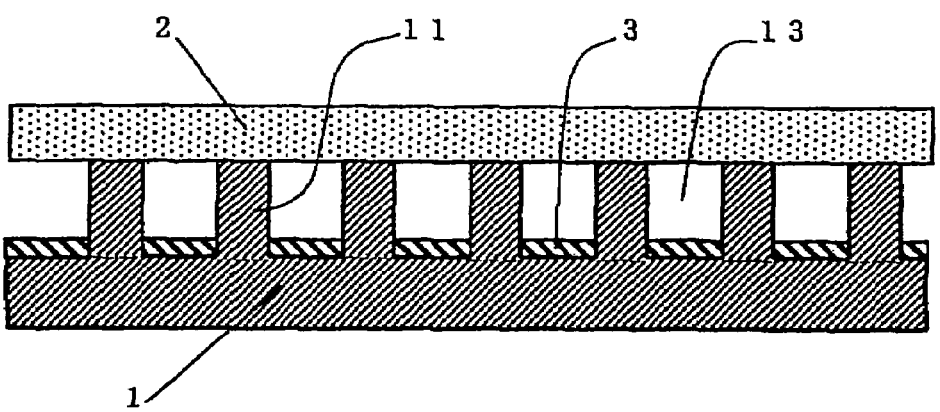
Figure 6:
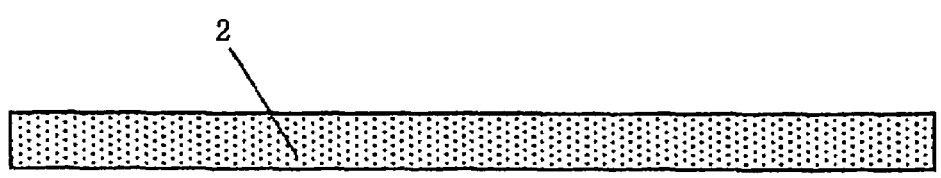

FIG. 1 (*a*)-(*c*) and FIG. 6 (*a*)-(*c*) are sectional views explaining the state of crystal growth of the semiconductor base of the present invention. FIG. 6 (*a*)-(*d*) are sectional views explaining the manufacturing methods of the semiconductor crystal of the present invention.

In the Figures, 1 is a substrate, 2 is a semiconductor crystal which is vapor phase grown on the substrate 1. On the crystal growth plane of the substrate 1, a convex part 11 and a concave part 12 are formed, so that crystal growth proceeds exclusively from an upper part of the aforementioned convex part 11. In the embodiment of FIG. 6, the concave part 12 is covered with a mask 3 on which the crystal cannot substantially grow.

The substrate of the present invention is a base on which to grow various semiconductor crystal layers, and on which even a buffer layer for lattice match has not been formed. Examples of such substrate include sapphire (C-plane, A-plane, R-plane), SiC (6H, 4H, 3C), GaN, Si, Spinel, ZnO, GaAs, NGO and the like. As long as the object of the invention is achieved, other materials may be used. It is also possible to use one stripped from these substrates.

A semiconductor crystal to be grown on the substrate 1 includes various semiconductor materials. As regards $Al_xGa_{1-x-y}In_yN$ ($0 \leq x \leq 1$, $0 \leq y \leq 1$), those having different x, y composition ratios, such as GaN, $Al_{0.5}Ga_{0.5}N$, $In_{0.5}Ga_{0.5}Ga_{0.5}N$ and the like, are exemplified.

In the case of a semiconductor material containing Al, such as AlGaN and the like, the conventionally unattainable lateral growth of AlGaN has been made possible, because the problem of growth on an $SiO_2$ mask layer, which is associated with the conventional mask method, can be overcome by the maskless method of the present invention, and therefore, a high quality film having a low dislocation can be grown directly on the substrate. As a result, absorption of light due to GaN layer, which is problematically found in an ultraviolet emitting element and the like, can be obliterated, which is particularly preferable in practice.

It is advantageous that the convex part 11 formed on the crystal growth plane of the substrate 1 have such a shape as permits crystal growth exclusively from an upper part thereof. As used herein, by the "crystal growth exclusively from an upper part" is meant the state wherein the crystal growth on the apex or in the apex plane or vicinity of the convex part 11 prevails. In this state, the growth in the concave may occur in the initial stage of growth, but ultimately, the crystal growth in the convex part 11 prevails. In other words, a low dislocation region formed by the lateral growth starting from the upper part as a starting point is effective as conventional ELO that requires a mask. Such growth can be characteristically achieved maskless according to the present invention.

In the embodiments shown in FIG. 6-FIG. 10, the mask 3, on which the crystal cannot substantially grow, is formed on the concave part 12. By the "on which the crystal cannot substantially grow" is meant a state wherein the crystal growth is difficult to proceed. In this state, the growth on the mask of the concave part may occur in the initial stage of growth, but ultimately, the crystal growth of the convex part 11 prevails.

In other words, low dislocation region formed by the lateral growth from the upper part as a starting point is effective as conventional ELO that requires a mask. The low dislocation density region can be characteristically grown by a single cycle of crystal growth by processing the substrate according to the present invention.

FIG. 1-3 and FIG. 6-8 are cross sectional views of the convex parts 11 formed to constitute stripes. In FIG. 1 and FIG. 6, substrate 1 having a greater groove depth (convex height) h than a groove width B, as shown in FIG. 1 (*a*) and FIG. 6(*a*), is exemplarily depicted. In this case, a sufficient amount of an ingredient gas does not reach the concave part 12 or the vicinity thereof. In the embodiment shown in FIG. 6, due to the mask 3 applied to the concave part 12, crystal growth occurs only from the upper part of the convex part 11. In FIG. 1(*b*) and FIG. 6(*b*), 20 is a crystal unit at the start of the crystal growth. Under the circumstances, as the crystal growth proceeds, the films grown in the lateral direction from the upper part of the convex part 11 as the starting point are connected and, as shown in FIG. 1(*c*), FIG. 6(*c*), the concavo-convex surface of the substrate 1 is covered, leaving cavity 13 in the concave part. In this case, a low dislocation region is formed in the part grown in the lateral direction, or the upper part of the concave part 12, as a result of which the film thus formed has high quality.

Figure 2:
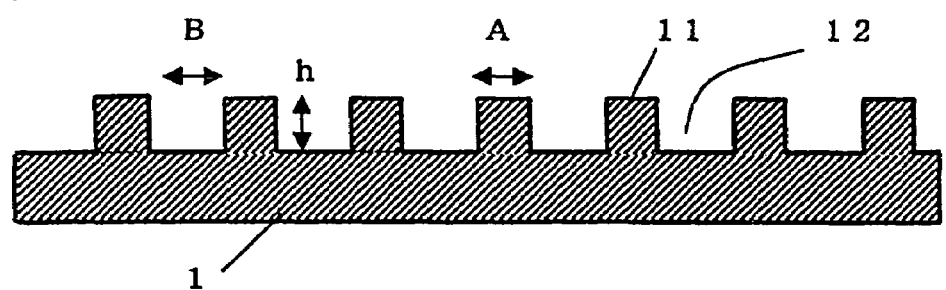
FIG. 2 is a sectional view explaining the state of crystal growth of the semiconductor base of the present invention.
Figure 2:
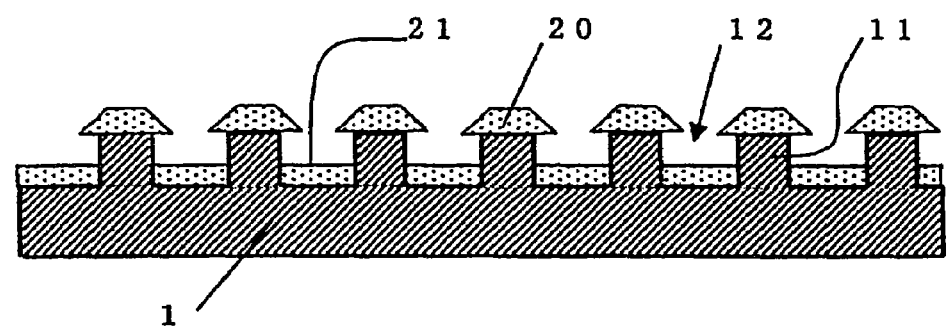
Figure 2:
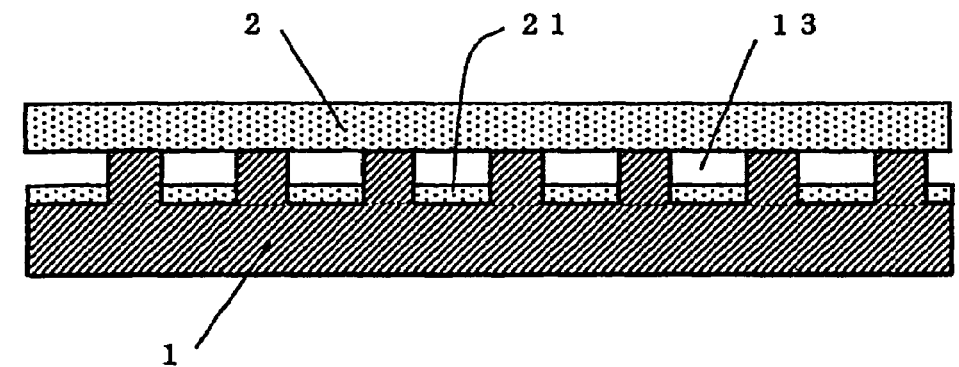
Figure 7:
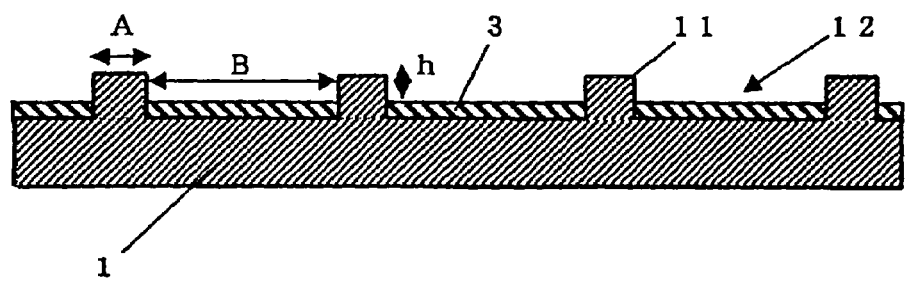
FIG. 7 is a sectional view explaining the state of crystal growth of the semiconductor base of the present invention and the manufacturing method of the semiconductor crystal of the present invention.
Figure 7:
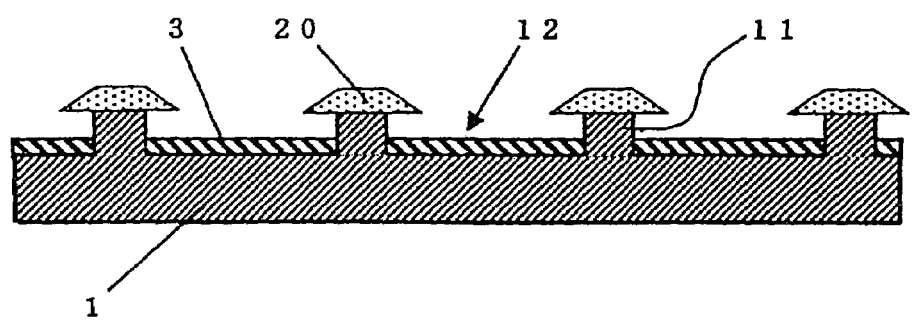
Figure 7:
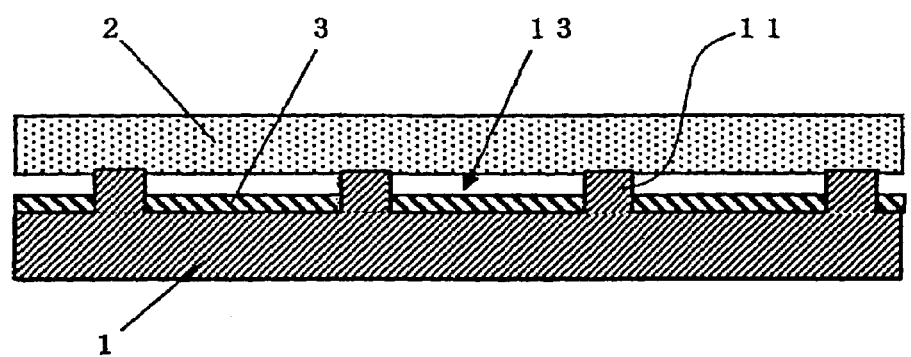
Figure 7:
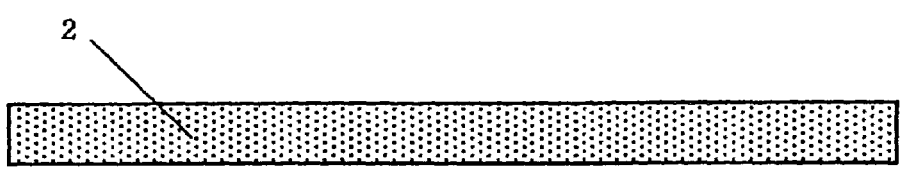

According to the method for manufacturing the semiconductor crystal of the present invention, a semiconductor base of the present invention (a laminate consisting of substrate 1 and semiconductor crystal 2 with cavity 13 between them), as shown in FIG. 1(*c*), FIG. 2(*c*), FIG. 6(*c*) and FIG. 7(*c*), is manufactured and substrate 1 and semiconductor crystal 2 are separated at a part including cavity parts 13, namely, the convex parts 11 of the substrate, as shown in FIG. 6(*d*) and FIG. 7(*d*), to give a desired semiconductor crystal 2 having low dislocation. For the separation, abrading and the like can be typically used but the method is not particularly limited as long as a semiconductor crystal can be taken out.

FIG. 2 shows an embodiment of a substrate 1 where the groove depth (convex height) h is smaller than the groove width B, or groove width B is wider than the width A of the convex part 11 (see FIG. 2(*a*)). In this case, the ingredient gas reaches the concave part 12 and the vicinity thereof, allowing the growth in the concave part 12. The crystal growth also proceeds from the upper part of the convex part 11, and as shown in FIG. 2(*b*), crystal units 20, 21 are formed on the upper part of the convex part 11 and the surface of the concave part 12. Under the circumstances, as the crystal growth proceeds, the films grown in the lateral direction from the upper part of the convex part 11 as the starting point are connected and, as shown in FIG. 2(*c*), the concavo-convex surface of the substrate 1 is covered. In this case, a low dislocation region is formed in the upper part of the concave part 12, as a result of which the film thus formed has high quality.

Figure 3:
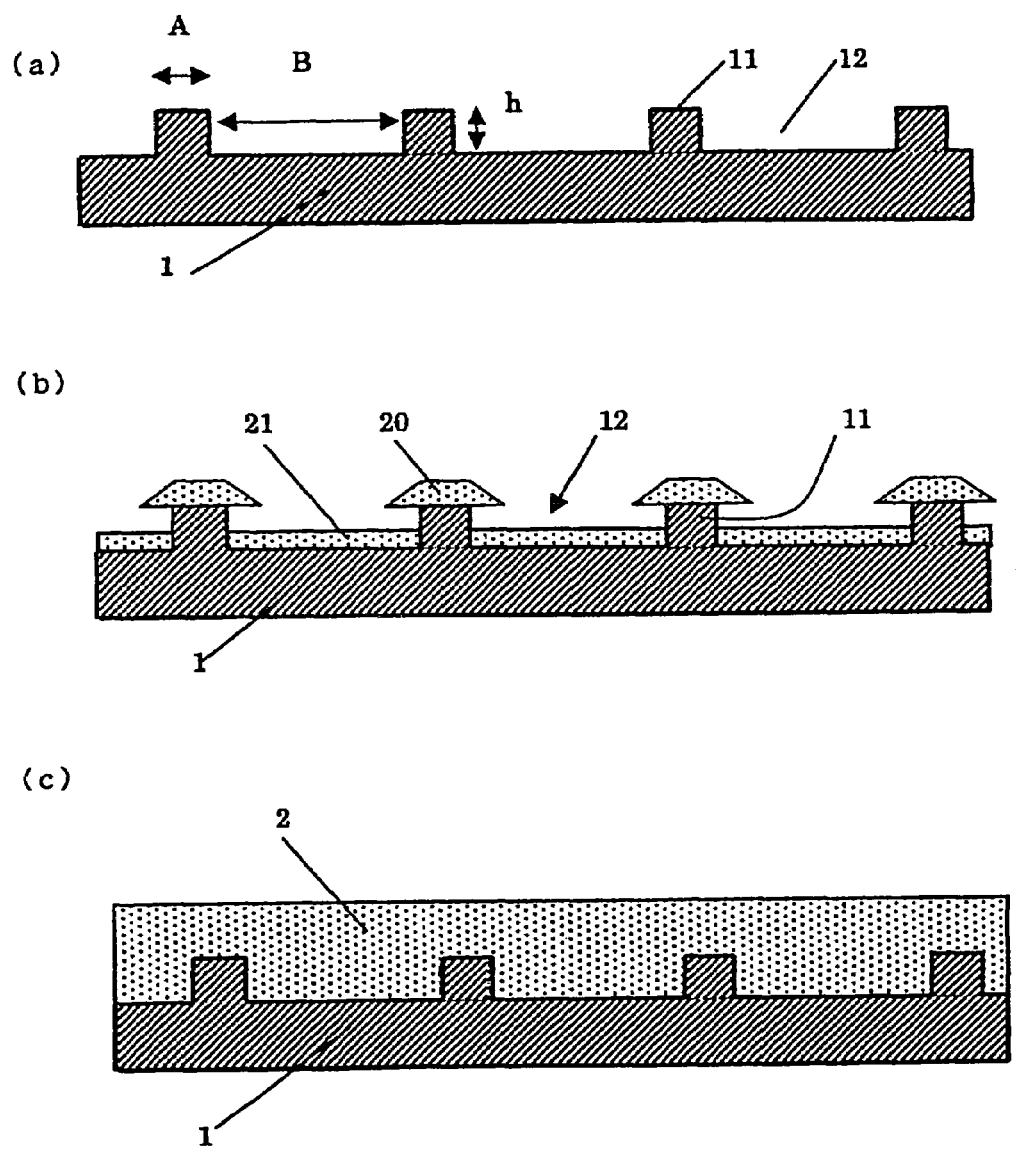
FIG. 3 is a sectional view explaining the state of crystal growth of the semiconductor base of the present invention.

FIG. 3, FIG. 7(*a*)-(*c*) show an embodiment of a substrate 1 where the groove depth (convex height) h is considerably smaller than the groove width B or the groove width B is markedly wider than the width A of the convex part 11 (see FIG. 3(*a*), FIG. 7(*a*)).

In the embodiment of FIG. 3, the ingredient gas reaches the concave part 12 and the vicinity thereof, allowing growth in the concave part 12. In the embodiment of FIG. 7, the ingredient gas reaches the mask 3 of the concave part 12 and the vicinity thereof, and there is a possibility that the crystals may grow on the concave part 12. As compared to the growth in the upper part of a convex part, however, the growth rate is extremely slow. This is attributable to the greater proportion of the ingredient material that reached mask 3 but is released again into the gas.

As shown in FIG. 3(*b*), FIG. 7(*b*), the crystal growth also proceeds from the upper part of the convex part 11, whereby crystal units 20, 21 are respectively formed on the upper part of the convex part 11 and the surface of the concave part 12. Under the circumstances, as the crystal growth proceeds, the films grown in the lateral direction from the upper part as the starting point are connected and, as shown in FIG. 3(*c*), FIG. 7(*c*), the concavo-convex surface of the substrate 1 is covered.

In the embodiment of FIG. 3, a low dislocation region is hardly formed in the part starting from the concave part 12, but a low dislocation region is formed in the part formed the growth in the lateral direction starting from the convex part 11, and the prepared film as a whole has higher quality. In the embodiment of FIG. 7, too, the proportion of the growth in the lateral direction starting from the convex part 11 is grater than in the embodiment of FIG. 1. Therefore, the proportion of low dislocation region is a greater and the prepared film as a whole has higher quality than the embodiment of FIG. 1.

When the concave part is wider and the dislocation extends in the C axis direction, the low dislocation region formed in the upper part of concave part has a greater area. In this case, registration with the emitting part of a light emitting element or with a light receiving part of a light receiving element is easily and conveniently done.

It is also possible to widen the low dislocation region of conventional ELO, but the layer needs to be made thick. A thick layer causes occurrence of camber, making the photolithography step in the process difficult.

According to the present invention, particularly an embodiment wherein a mask is formed in the concave part enables formation of a large low dislocation region on a thin film. As a result, the occurrence of camber can be suppressed, and when a semiconductor element having a large area (e.g., light receiving element etc.) is to be formed, the occurrence of problems caused by camber in a photolithography step can be suppressed. Therefore, an element having improved properties, as compared to conventional ones, in low dark current, high speed of response and the like can be obtained.

According to the manufacturing method of the semiconductor crystal of the present invention, a laminate is prepared as mentioned above and, substrate 1 and semiconductor crystal 2 are separated as shown in FIG. 7(*d*) at a part containing cavity 13, or the convex part 11 of the substrate 1, whereby a semiconductor crystal 2 having a desired low dislocation can be obtained.

In the present invention, the convex part 11 is subject to no particular limitation and various shapes can be employed.

To be specific, various combinations where groove depth (convex height) h is greater than the groove width B, groove depth (convex height) h is smaller than the groove width B, groove depth (convex height) h is strikingly smaller than the groove width B, groove width B is strikingly larger than the width A of convex 11 and the like can be employed. Particularly, when the groove depth (convex height) h is greater than the groove width B, the ingredient gas cannot substantially diffuse to the bottom during vapor phase growth, even without a mask on the surface of the concave part, as shown in FIG. 1. Therefore, the ingredient material efficiently contributes to the growth on the upper part of the convex part 11. When the groove width B is greater than the width A of the convex part 11, the region of the growth in the lateral direction becomes larger and a low dislocation region is preferably formed widely.

When the dislocation from the sapphire substrate extends straight, the proportion of the convex part is smaller, wherein a narrower width advantageously results in a smaller number of dislocations. The area occupied by the convex part is preferably not more than 50%, desirably not more than 40%, more desirably not more than 30%. A narrower convex width means a higher effect, which is preferably not more than 5 μm, desirably not more than 2 μm, more preferably 0<convex<1 μm.

When the convex is narrow, the thickness necessary to make the concave part flat by covering same becomes beneficially smaller. Therefore, the problem of camber caused by the differences in the thermal expansion coefficients can be overcome because of the thin layer that needs to be grown. When the convex is narrow and the area occupied by the convex is small, the above-mentioned effect is joined by an effect of less dislocation and a more superior effect can be achieved. The groove depth (height of convex) is determined from the range capable of affording the effect of the present invention.

For forming such a concavo-convex surface, island type intersperse convex parts, stripe type convex parts consisting of convex lines, lattice convex parts, convex parts, wherein the lines forming these are curves and the like, can be employed.

Of the embodiments of these convex parts, the stripe type forming convex lines is preferable because the manufacturing steps can be simplified and regular patterns can be easily formed. While the longitudinal direction of the stripe is optional, when the material to be grown on a substrate is GaN and the direction is the <1-100> direction of the GaN group material, the diagonal facet, such as the {1-101} plane and the like, is not easily formed, thereby quickening the growth in the lateral direction (lateral growth). Consequently, the concavo-convex surface is covered faster, which is particularly preferable.

When the growth conditions, under which a diagonal facet such as the {1-101} plane and the like is formed, (e.g., low temperature of growth, high $H_2$ concentration etc.), are employed, the dislocation from the substrate first extends straight in the convex part (C axis direction in the case of sapphire C-plane substrate), curves in the facet plane, and may join in the center of the concave part. In this event, a low dislocation region becomes the upper part of the convex part. Thereafter, gas atmosphere, grow temperature and the like are changed to promote the lateral growth, whereby a flat film covering the C-plane can be obtained. When the stripe direction is set to the <11-20> direction, too, the selection of the growth conditions apparently makes a method similar to the above-mentioned method.

The mask 3 to be formed on the concave part 12 needs only to prevent substantial growth thereon, and $SiO_2$, $SiN_x$, $TiO_2$, $ZrO_2$ and the like can be used. It is possible to make a laminate of these materials. According to the manufacturing method of the semiconductor crystal of the present invention, a mask 3 is formed on the concave part 12. The use of a concavo-convex shaped substrate alone without forming a mask 3 is also acceptable.

As in the Examples shown in FIG. 1 and FIG. 6, when the concavo-convex surface of the substrate 1 is buried leaving the cavity 13, and an emitting part is grown thereon to give a light emitting element, the difference in the refractive index between the cavity and the semiconductor at the interface can be made greater. As a result, a greater proportion of the light headed for the downside of the emitting part is reflected at the interface. For example, when LED is prepared with the sapphire substrate plane placed downside for die bonding, the amount of the light taken out upward preferably increases.

The embedding leaving the cavity 13 reduces the contact area between the substrate 1 and the semiconductor layer to be grown thereon. Thus, the strain produced in the semiconductor, which is caused by difference in lattice constant and thermal expansion coefficient, can be preferably reduced. The reduction of the strain is effective for reducing the camber that occurs when a GaN group material is grown thick on sapphire. Particularly, the conventional methods are associated with the problem of occurrence of camber and cracks due to the difference in thermal expansion coefficients when a GaN group material is crystal grown on an Si substrate, which prevents fine crystal growth. The reduction of the strain by the present invention overcomes this problem.

By utilizing the capability of minimizing the contact area between the substrate 1 and the semiconductor layer 2 grown thereon, the semiconductor layer 2 can be grown thick. As a result, the stress gathers on the small contact part, from where the substrate 1 can be separated from the semiconductor layer 2. By utilizing this effect, substrates of GaN and the like can be prepared.

Figure 10:
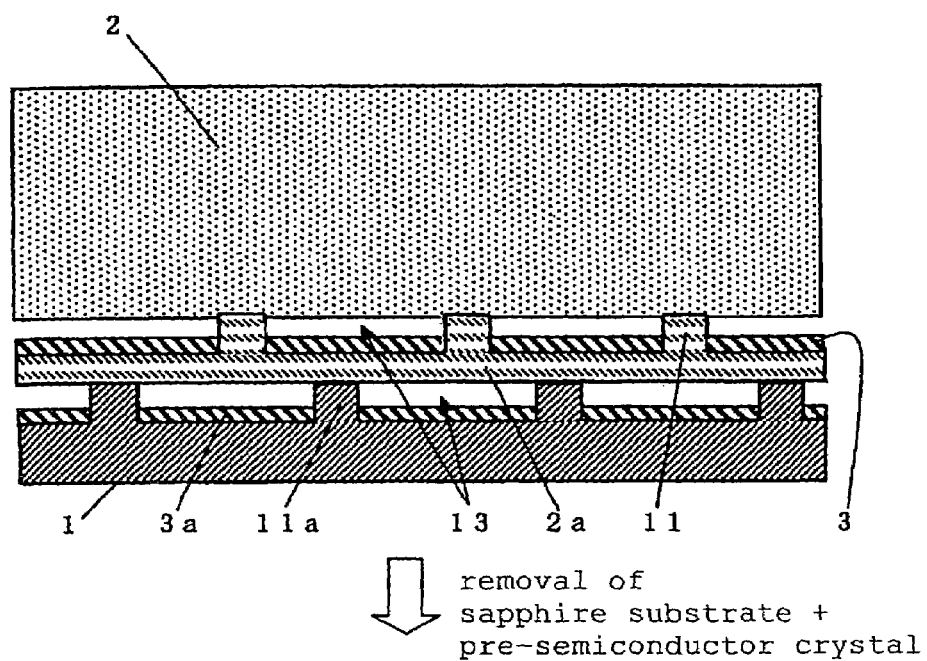
FIG. 10 is a sectional view explaining a different embodiment of the manufacturing methods of the semiconductor crystal of the present invention.
Figure 10:
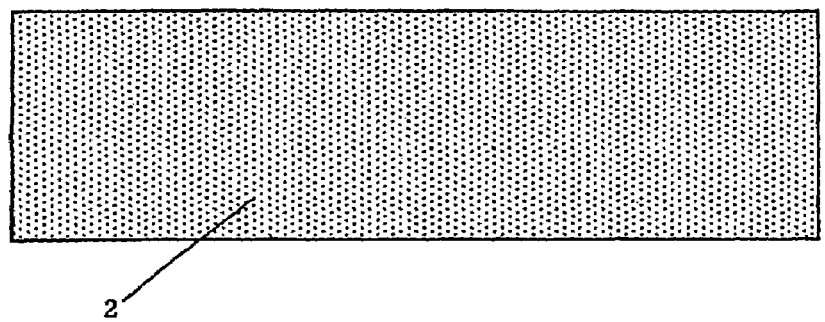

According to the manufacturing method of the semiconductor crystal of the present invention, a cavity 13 is formed between the substrate 1 and the semiconductor crystal 2 to minimize the contact area between them, as shown in FIG. 6(c), FIG. 7(c) and FIG. 10. Consequently, the strain caused by differences in lattice constant and thermal expansion coefficient in the semiconductor crystal 2 can be reduced. The reduction of the strain has an effect of reducing the camber that noticeably occurs when a GaN group material as a semiconductor crystal 2 is grown thick on sapphire employed as a substrate 1. Particularly, camber and cracks occur due to the difference in thermal expansion coefficients when a GaN group material is crystal grown on a substrate by a conventional method, which prevents fine crystal growth. This problem can be reduced by the strain reduction effect by the presence of cavity 13.

According to the manufacturing method of the semiconductor crystal of the present invention, by utilizing the capability of minimizing the contact area between the substrate 1 and the semiconductor layer 2 grown thereon, as mentioned above, when the film is grown to a thickness of not less than 10 μm, preferably not less than 100 μm, the stress concentrates to the small contact part, from where the separation of the substrate 1 and the semiconductor layer 2 can be facilitated. In this way, a substrate of GaN and the like can be prepared.

Figure 5:
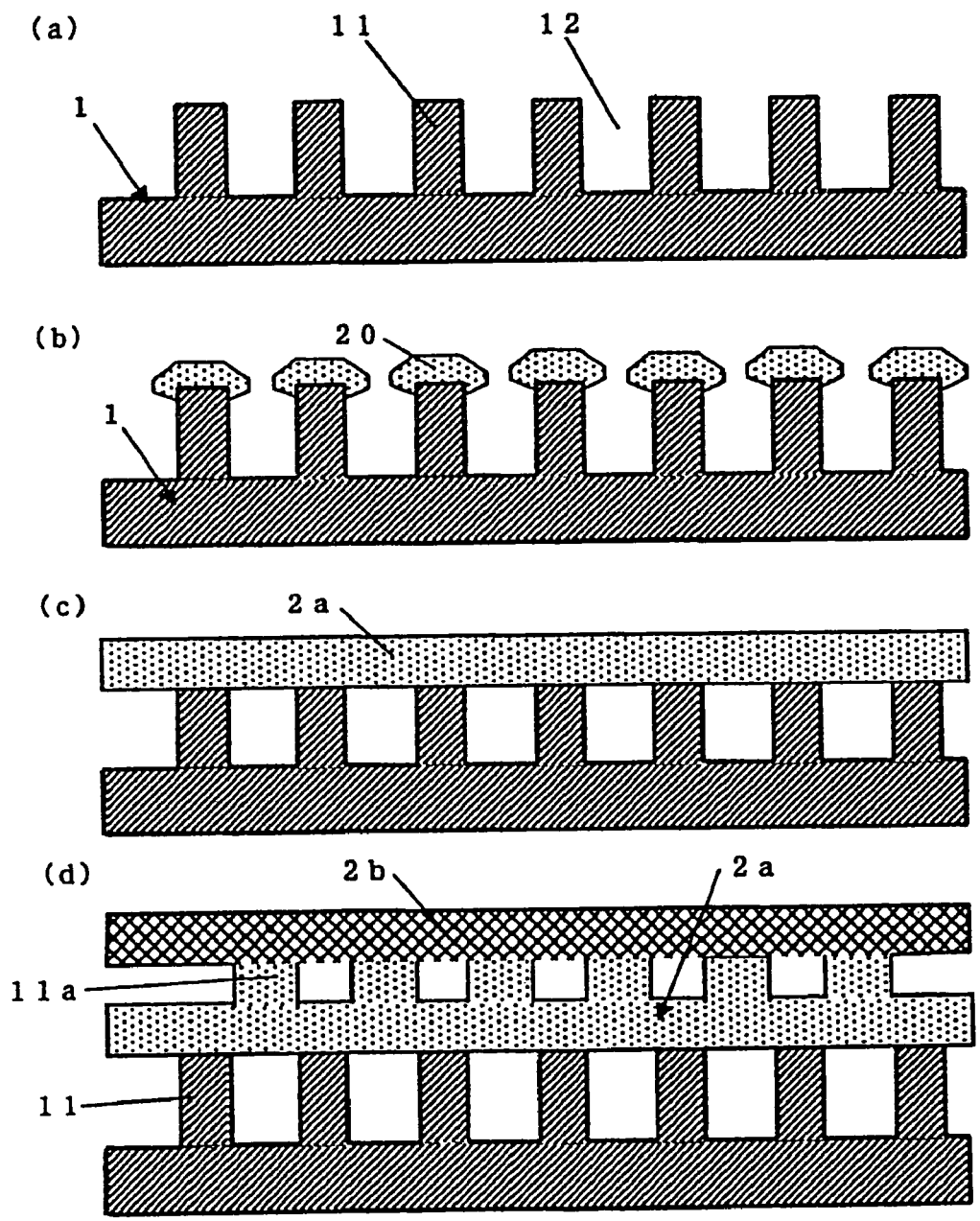
FIG. 5 is a sectional view explaining the state of crystal growth of the semiconductor base of the present invention.
Figure 8:
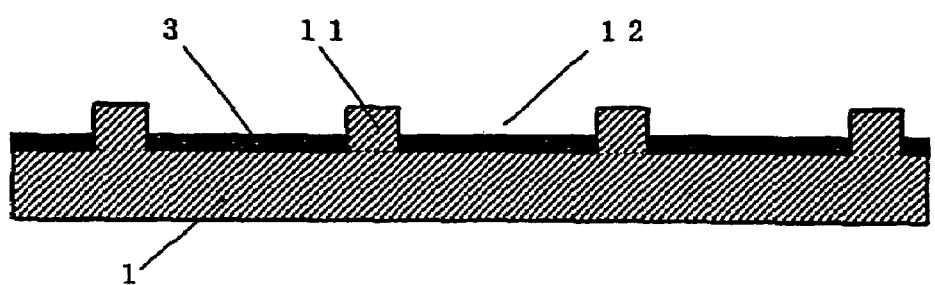
FIG. 8 is a sectional view explaining the state of crystal growth of the semiconductor base of the present invention.
Figure 8:
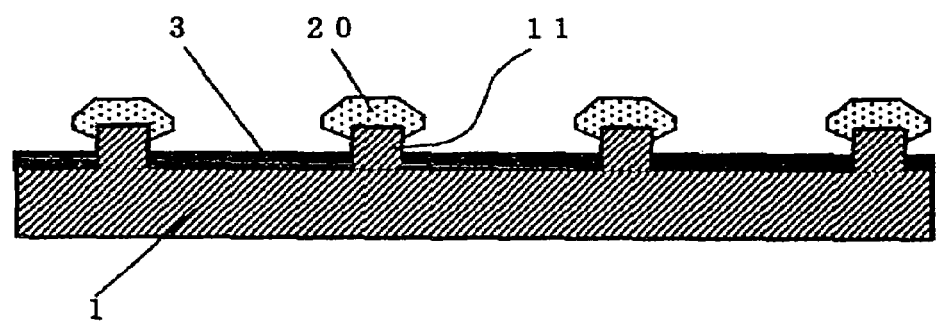
Figure 8:
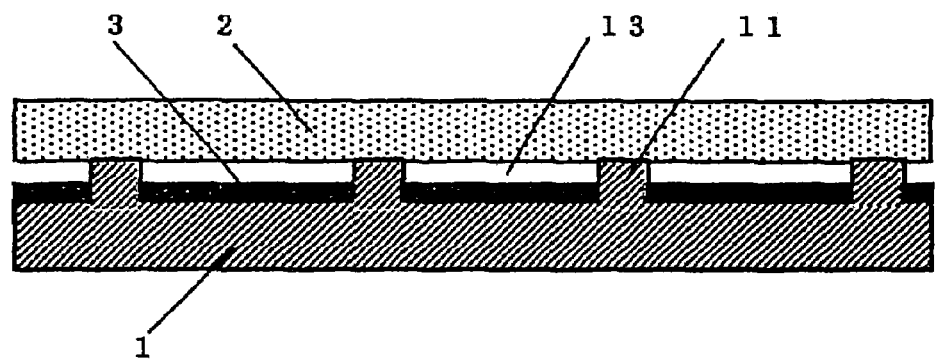
Figure 9:
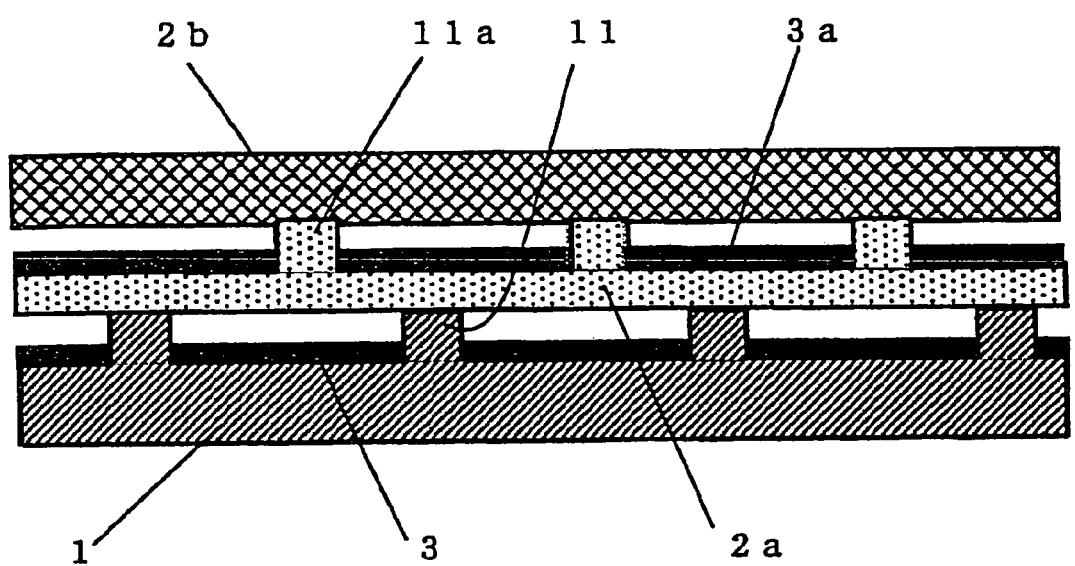
FIG. 9 is a sectional view explaining the state of crystal growth of the semiconductor base of the present invention.

While the above explanation concerns the case where only one layer of semiconductor layer 2 is grown on the substrate 1, a similar step may be repeated to further reduce the dislocation defect. As shown in FIG. 5, FIG. 8 and FIG. 9, after crystal growth of the first semiconductor crystal layer (the first semiconductor layer) 2a to cover the concavo-convex surface of the substrate 1 in the same manner as the above-mentioned, the surface of the first semiconductor layer 2a is processed to have a concavo-convex surface, on which surface a second semiconductor crystal layer (the second semiconductor layer) 2b may be formed by crystal growth by vapor phase growth exclusively from an upper part of the convex part of the first semiconductor layer 2a. In this case, if particularly the convex part 11 of the substrate 1 and the convex part 11a to be formed on the above-mentioned first semiconductor layer 2a are dislocated (namely, by forming a concave cavity part of the first semiconductor layer 2a on a region to which dislocation is propagated from the substrate), the second semiconductor layer 2b is free of propagation of the dislocation. In other words, by this constitution, the entirety of the second semiconductor layer 2b can be a low dislocation region, thereby providing a semiconductor base having a semiconductor crystal layer having a still higher quality. Thereafter, the semiconductor crystal 2 (the second semiconductor layer 2b) is separated from the laminate (semiconductor base) at the cavity 13, as shown in FIG. 10, whereby the necessary semiconductor crystal 2 can be taken out.

It is possible to prevent propagation by forming a mask, such as $SiO_2$ and the like, on the part of the first semiconductor layer, where the dislocation is propagated. That is, the conventionally reported ELO technique may be used for the growth of the second semiconductor layer. In this case, since the first semiconductor layer is formed according to the present invention, there are achieved apparent effects absent in the use of ELO alone, such as thin film, less number of steps and the like.

It is also possible to process the surface of the second semiconductor layer 2b into a concavo-convex surface, on which to form a third semiconductor crystal layer (the third semiconductor layer) by vapor phase growth in the same manner as above. Alternatively, a similar step may be repeated to form plural semiconductor layers in a multiple manner. By this constitution, the dislocation propagated as laminating the layers can be gradually reduced, even without the intentional positional adjustment of the convex part between above and below, as mentioned above, whereby the semiconductor base to be ultimately grown, and the semiconductor crystal separated therefrom, can be made to have a higher quality.

A convex part can be prepared by, for example, forming a pattern according to the shape of the convex part by a conventional photolithography technique, and etching by RIE technique and the like.

A semiconductor layer is preferably formed on a substrate by crystal growth by HVPE, MOCVD, MBE and the like. When a thick film is to be prepared, HVPE is preferable, and a thin film is preferably prepared by MOCVD.

The growth conditions (kind of gas, growth pressure, growth temperature and the like) for crystal growth of the semiconductor layer on a substrate can be determined as necessary according to the object, as long as the effect of the present invention is achieved.

EXAMPLES

Example 1

A photoresist was placed to form a pattern (width: 2 μm, period: 4 μm, stripe direction: stripe extending direction being <11-20> direction of sapphire substrate) on a C-plane sapphire substrate. The substrate was etched to form a quadrate shape cross section having a depth of 5 μm with RIE (Reactive Ion Etching) apparatus. The width 2 μm of the aforementioned pattern corresponded to the width of a convex part. Therefore, the width (=period−width of convex) of a concave part was 2 μm, and the aspect ratio (depth/width of concave) then of the concave part cross section was 2.5. After removal of the photoresist, the substrate was set on the MOVPE apparatus. Thereafter, the temperature was raised to 1100° C. under a hydrogen atmosphere, and thermal etching was performed. The temperature was lowered to 500° C., and TMG (hereinafter TMG) as a III group ingredient material and ammonia as an N ingredient material were flown, whereby a GaN low temperature buffer layer was grown. The temperature was raised to 1000° C., TMG and ammonia as ingredient materials and silane as a dopant were flown, whereby an n-type GaN layer was grown. The time of growing corresponded to the time necessary for growing GaN in a thickness of 4 μm in a conventional case without concavo-convex.

The cross section after the growth was observed. As a result, the concave part of the substrate showed some trace of growth, but, as shown in FIG. 1(c), the concavo-convex was covered leaving the cavity 13 in the concave part, whereby a flat GaN film was obtained.

For comparison, a GaN layer formed on a conventional C-plane sapphire substrate under the same growth conditions and a GaN film ELO grown using an $SiO_2$ mask having the same pattern (conventional ELO sample by the mask method) were prepared.

For evaluation, InGaN (InN mixed crystal ratio=0.2, 100 nm thickness) was continuously grown and the pits (corresponding to dislocation) appeared thereon were counted and taken as dislocation density. The carrier density was evaluated by Hall effect measurement, and fluctuation of the crystal axis was evaluated by ¢ scan of XRC. The evaluation results are shown in Table 1, FIG. 4.

TABLE 1

| sample | dislocation density | carrier density | FWHM of XRC |
|---|---|---|---|
| Example sample | $4 \times 10^7$ cm$^{-2}$ | $1 \times 10^{16}$ cm$^{-3}$ | 170 sec |
| Conventional ELO sample | $4 \times 10^7$ cm$^{-2}$ | $5 \times 10^{17}$ cm$^{-3}$ | 200-400 sec |
| Normal GaN | $2 \times 10^9$ cm$^{-2}$ | $1 \times 10^{16}$ cm$^{-3}$ | 220 sec |

The Example sample showed reduction of dislocation density to the same level as the level of conventional ELO. on the other hand, the carrier concentration was of the same level as normal GaN growth. FWHM of XRC was the smallest and 170 sec. As an overall evaluation, the film had high quality.

Figure 4:
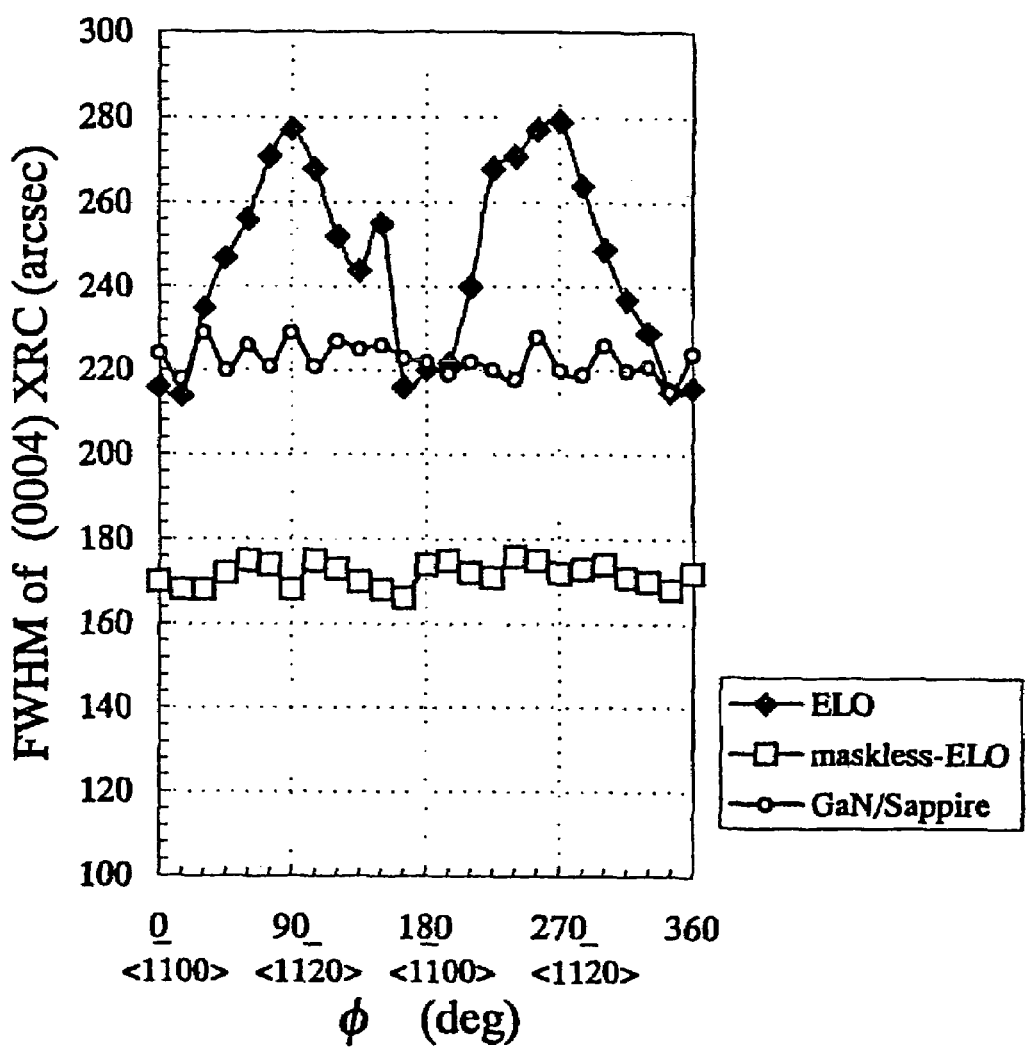
FIG. 4 is a graph showing the θ scan data of XRC.

It was also confirmed from XRC ¢ scan data of FIG. 4 that the crystal had a high quality without fluctuation of the crystal axis intensified near the lateral growth direction, like the GaN film prepared by ELO growth using an $SiO_2$ mask.

Example 2

This Example followed Example 1 except the shape of the concavo-convex part, which was changed to the following. (width: 2 μm, period:4 μm, stripe direction: <11-20> of sapphire substrate) The substrate was etched to form a quadrate shape cross section having a depth of 1 μm with RIE (Reactive Ion Etching) apparatus. The aspect ratio then was 0.25.

The cross section after the growth was observed. As a result, the concavo-convex part was buried and the part corresponding to the concave part 12 was substituted by the cavity 13 and the GaN film 21 on the bottom thereof, as shown in FIG. 2(c).

For evaluation of this film, InGaN (InN mixed crystal ratio=0.2, 100 nm thickness) was continuously grown and the pits appeared thereon as mentioned above were observed. As a result, many pits corresponding to the dislocation were observed in the upper part of the convex part, but the pits seen in the part grown in the lateral direction from the upper part of the convex part as a starting point were small in number, wherein the dislocation density was $4 \times 10^7$ cm$^{-2}$ as in Example 1.

Example 3

This Example followed Example 1 except the shape of the concavo-convex part, which was changed to the following and the layer grown on the concavo-convex part had a thickness of 1 μm.

(width: 0.5 μm, period: 1 μm, stripe direction: <11-20> of sapphire substrate). The substrate was etched to form a quadrate shape cross section having a depth of 1.0 μm with RIE apparatus.

The cross section after the growth was observed. As a result, the concavo-convex part was buried and the surface was flat. By shortening the width and period, a film already having a flat surface at a thickness of 1 μm can be obtained. For evaluation of this film, InGaN (InN mixed crystal ratio=0.2, 100 nm thickness) was continuously grown and the pits were observed as in the above Examples. Many pits corresponding to dislocation appeared in the upper part of the convex part but the pits seen in the part grown in the lateral direction from the upper part of the convex part as a starting point were small in number, wherein the dislocation density was $4 \times 10^7$ cm$^{-2}$ as in Example 1.

Example 4

This Example followed Example 1 except the shape of the concavo-convex part, which was changed to the following. (width: 0.3 μm, period: 3 μm, stripe direction: <11-20> of sapphire substrate) The substrate was etched to form a quadrate shape cross section having a depth of 3.0 μm with RIE apparatus.

The cross section after the growth was observed. As a result, the concavo-convex part was buried and the outermost surface was flat. For evaluation of this film, InGaN (InN mixed crystal ratio=0.2, 100 nm thickness) was continuously grown and the pits appeared were observed as mentioned above.

Pits corresponding to dislocation appeared in the upper part of the convex part but the number was markedly smaller. The pits seen in the part grown in the lateral direction from the upper part of the convex part as a starting point were small in number. On the other hand, some pits were found in the center of the concave part. The dislocation density of this film was $2 \times 10^6$ cm$^{-2}$, showing considerable decrease as compared to Example 1, 2 and conventional GaN growth. This is considered to be attributable to the reduced area occupied by the convex part and the reduced number of dislocation propagated.

Example 5

An n-type AlGaN clad layer, an InGaN light emitting layer, a p-type AlGaN clad layer and a p-type GaN contact layer were successively formed on the film obtained in Example 1 to give an ultraviolet LED wafer having a light emission wavelength of 370 nm.

Thereafter, an electrode was formed and divided into elements to give LED elements. The average output and reverse current property of the LED chips obtained from the whole wafer were evaluated. The comparison objects were ultraviolet LED chip having the above-mentioned structure formed using a conventional ELO technique and an ultraviolet LED chip having the above-mentioned structure formed by the conventional sapphire substrate. The evaluation results of these are shown in Table 2.

TABLE 2

| sample | Output (20 mA) | current leaked by application of −10 V |
|---|---|---|
| Example sample | 1.7 mW | 10 nA |
| conventional ELO sample | 1.5 mW | 50 nA |
| normal GaN | 0.9 mW | 1 μA |

As is shown in Table 2, the sample prepared according to the present invention showed higher output than the conventional samples, and it was found that a high quality LED associated with less current leakage could be prepared.

Example 6

This Example followed Example 1 except trimethyl aluminum (TMA) was added during the growth of a semiconductor layer.

As a result, an AlGaN (AL composition 0.2) film left a cavity in the concave part and the film covering the concavo-convex part was grown flat. The pits appeared in the part grown in the lateral direction starting from the upper part of the convex part as a starting point was small in number. Consequently, an AlGaN film having high quality (low dislocation density), that could not be afforded by a conventional ELO technique, was confirmed to have been achieved by the present invention.

Example 7

In the next example, GaN was used as a substrate. A photoresist was placed to form a pattern on a GaN substrate (width: 2 μm, period: 4 μm, stripe direction: <1-100> of GaN substrate), and the substrate was etched to form a quadrate shape cross section having a depth of 5 μm with RIE apparatus. The aspect ratio then was 2.5. After removal of the photoresist, the substrate was set on the MOVPE apparatus. Thereafter, the temperature was raised to 1000° C. under an atmosphere of a nitrogen, hydrogen and ammonia mixture. Then, TMG and ammonia as ingredient materials and silane as dopant were flown, whereby an n-type GaN layer was grown. The time of growing then corresponded to the time necessary for growing GaN in a thickness of 4 μm in a conventional case without concavo-convex.

The cross section after the growth was observed. As a result, the growth in the substrate concave part and the growth on the side surface of the convex part were found but, as shown in FIG. 5, the concavo-convex part was covered leaving the cavity, whereby a flat GaN film was obtained. Then, the pits in the obtained film were evaluated. GaN used as a substrate had a pit density of $2 \times 10^5$ cm$^{-2}$. By the growth of this Example, the pits decreased to $1 \times 10^5$ cm$^{-2}$ in the upper part of the convex and $5 \times 10^3$ cm$^{-2}$ in the upper part of the concave part. It was confirmed that a dislocation density reduction effect was present in a substrate having already less dislocation.

Example 8

Using the GaN crystal prepared in Example 1 was used as a first semiconductor layer, a second semiconductor layer was grown thereon. First, a photoresist was placed to form a pattern (width: 2 μm, period: 4 μm, stripe direction: <1-100> of GaN substrate) on a GaN crystal (the first semiconductor layer) and the substrate was etched to form a quadrate shape cross section having a depth of 2 μm with RIE apparatus. The formation of the pattern included registering the concave part of the first semiconductor layer to the substrate convex part. The aspect ratio then was 1. After removal of the photoresist, the substrate was set on the MOVPE apparatus. Thereafter, the temperature was raised to 1000° C. under an atmosphere of a nitrogen, hydrogen and ammonia mixture. Then, TMG and ammonia as ingredient materials and silane as a dopant were flown, whereby an n-type GaN layer was grown. The time of growing then corresponded to the time necessary for growing GaN in a thickness of 4 μm in a conventional case without concavo-convex.

The cross section after the growth was observed. As a result, the growth in the substrate concave part and the growth on the side surface of the convex part were found, but the concavo-convex part was covered leaving the cavity, and a flat GaN film was obtained. Subsequently, the pits in the obtained film were evaluated to find a decrease to $8 \times 10^5$ cm$^{-2}$ in number. By repeating this Example, a further effect on the reduction of dislocation density was confirmed to be achieved.

Example 9

A photoresist was placed to form a pattern on a C-plane sapphire substrate (width: 2 μm, period: 6 μm, stripe direction: stripe extending direction being <11-20> direction of sapphire substrate), and the substrate was etched to form a quadrate shape cross section having a depth of 2 μm with RIE apparatus. An $SiO_2$ film was deposited on the entirety of the substrate in a thickness of 0.1 μm, and the photoresist and the $SiO_2$ film deposited thereon were removed by a lift-off step. In this way, a mask layer was formed on the substrate concave part. Thereafter, the substrate was set on an MOVPE apparatus, the temperature was raised to 1100° C. under a hydrogen atmosphere to apply and thermal etching. Then, the temperature was lowered to 500° C., and TMG as a III group ingredient material and ammonia as an N ingredient material were flown, whereby a GaN low temperature buffer layer was grown. The temperature was raised to 1000° C., and TMG and ammonia as ingredient materials and silane as a dopant were flown, whereby an n-type GaN layer was grown on the substrate. The time of growing then corresponded to the time necessary for growing GaN in a thickness of 4 μm in a conventional case without concavo-convex.

After the growth, the cross section was observed. As a result, the mask on the substrate concave part showed some trace of growth but, as shown in FIG. 7(*c*), the concavo-convex part was covered leaving the cavity 13 in the concave part, whereby a flat GaN film was obtained. For comparison, similar study was done by a conventional ELO method. An $SiO_2$ mask (i.e., mask width 4 μm, period 6 μm) corresponding to the width and period of the concavo-convex of this Example was formed and grown for a period corresponding to the time necessary for growing normal GaN in a thickness of 4 μm. The cross section of the obtained sample was observed. As a result, growth in the lateral direction occurred on the $SiO_2$ mask, and though the junction was observed, the surface had not become flat yet. The growth time necessary for making the surface flat was examined, and found to be the time corresponding to the time necessary for growing GaN in a thickness of 10 μm by conventional GaN growth. In this case, while the surface of the crystal layer was flat, the obtained wafer showed considerable camber as a result of thickening of the film.

As is evident from the comparison in this Example, the use of the present invention affords a thin and flat film surface even if the concave part to be subjected to lateral growth is wide.

Example 10

GaN was used as a substrate in the next example. A photoresist was placed to form a pattern on a GaN substrate (width: 2 μm, period: 6 μm, stripe direction: <1-100> of GaN substrate), and the substrate was etched to form a quadrate shape cross section having a depth of 2 μm with RIE apparatus. An $SiO_2$ film was deposited on the entirety of the substrate in a thickness of 0.1 μm, and the photoresist and the $SiO_2$ film deposited thereon were removed by a lift-off step. The GaN substrate thus processed was set on an MOVPE apparatus, and the temperature was raised to 1000° C. under an atmosphere of a nitrogen, hydrogen and ammonia mixture. Then TMG and ammonia as ingredient materials and silane as a dopant were flown, whereby an n-type GaN layer was grown. The time of growing then corresponded to the time necessary for growing GaN in a thickness of 4 μm in a conventional case without concavo-convex.

After the growth, the cross section was observed. As a result, the mask on the concave part of the substrate showed some trace of growth and growth in the side surface of the convex part, but, as shown in FIG. 8, the concavo-convex was covered leaving the cavity part, whereby a flat GaN film was obtained. Then, the pits of the obtained film were evaluated.

GaN used as a substrate had a pit density of $2 \times 10^5$ cm$^{-2}$. By the growth of this Example, the pits decreased to $1 \times 10^5$ cm$^{-2}$ in the upper part of the convex part and $5 \times 10^3$ cm$^{-2}$ in the upper part of the concave part. It was confirmed that a dislocation density reduction effect is achieved on a substrate having already less dislocation.

Example 11

Using the GaN crystal prepared in Example 9 as a first semiconductor layer, a second semiconductor layer was grown thereon. First, a photoresist was placed to form a pattern (width: 2 μm, period: 6 μm, stripe direction: <1-100> of GaN substrate) on a GaN crystal (the first semiconductor layer) and the substrate was etched to form a quadrate shape cross section having a depth of 2 μm with RIE appartus. The formation of the pattern included registering the concave part of the first semiconductor layer to the substrate convex part. An $SiO_2$ film was deposited on the entirety of the substrate in a thickness of 0.1 μm, and the photoresist and the $SiO_2$ film deposited thereon were removed by a lift-off step. Thereafter, the substrate was set on an MOVPE apparatus, the temperature was raised to 1000° C. under an atmosphere of a nitrogen, hydrogen and ammonia mixture. Then, TMG and ammonia as ingredient materials and silane as a dopant were flown, whereby an n-type GaN layer was grown. The time of growing then corresponded to the time necessary for growing GaN in a thickness of 4 μm in a conventional case without concavo-convex.

Then, the pits of the obtained film were evaluated. As a result, the pits decreased to $8 \times 10^5$ cm$^{-2}$. By repeating this Example, a further effect of the reduction of dislocation density was confirmed to be achieved.

In this Example, a $SiO_2$ film was formed on the concave part of the first semiconductor layer. Even if a $SiO_2$ film was not formed, by making the thickness of the second semiconductor layer 6 μm, similar results were obtained.

Example 12

In the same manner as in the above-mentioned Example 9, a mask layer was formed on the concave part of a substrate, a GaN low temperature buffer layer was grown, the temperature was raised to 1000° C., and TMG and ammonia as ingredient materials and silane as a dopant were flown for 10 h to grow an n-type GaN layer in the thickness of 30 μm.

The obtained GaN crystal was observed. As a result, camber slightly occurred but the crystal was free of cracks or breakage, and the obtained was a mirror plane. The cross section after the growth was observed. As a result, the mask on the concave part of the substrate showed some trace of growth, but, as shown in FIG. 7(*c*), the concavo-convex of the substrate was covered leaving the cavity 13 in the concave part, whereby a flat GaN crystal was obtained.

Comparative Examples 1, 2

For comparison, a GaN layer formed on a conventional C-plane sapphire substrate under the same growth conditions (Comparative Example 1), and a GaN film ELO grown using an $SiO_2$ mask having the same pattern (Comparative Example 2) were prepared.

After the growth, the samples were taken out from the apparatuses. The sample grown without any treatment was found to have been broken into small pieces with a number of cracks. The ELO grown sample was free of breakage but contained considerable cambers and a number of cracks.

The GaN crystal obtained in Example 12 and the GaN crystal obtained by ELO growth in Comparative Example 2 were separated from the substrate. The GaN crystal surface was fixed with a wax with the surface downside. Thereafter, the sapphire substrate was removed by abrasion.

The GaN crystal obtained by ELO growth in Comparative Example 2 was incapable of uniform abrasion due to the considerable camber. After the abrasion, the GaN crystal was released from the wax. The sample prepared in Example 1 permitted taking out of the GaN crystal, but the GaN crystal sample ELO grown in Comparative Example 2 broke into pieces.

Example 13

As shown in FIG. 10, the GaN crystal free of the separation from the sapphire substrate, as obtained in Examples 12, was used as the first semiconductor layer 2a, and the second semiconductor layer 2 was grown thereon. First, a photoresist was placed to form a pattern on the GaN first semiconductor layer (width: 2 μm, period: 6 μm, stripe direction: <1-100> direction of GaN substrate), and the substrate was etched to form a quadrate shape cross section having a depth of 2 μm with RIE apparatus. The formation of the pattern here included making the part of the first semiconductor layer, where dislocation was frequent, a concave part. An $SiO_2$ film was deposited on the entirety of the substrate in a thickness of 0.1 μm, and the photoresist and the $SiO_2$ film deposited thereon were removed by a lift-off step. Thereafter, the substrate was set on an MOVPE apparatus, and the temperature was raised to 1000° C. under an atmosphere of a nitrogen, hydrogen and ammonia mixture. The TMG and ammonia as ingredient materials and silane as a dopant were flow, whereby an n-type GaN layer was grown. The time of growing then corresponded to the time necessary for the growth of 4 μm thickness of GaN grown in a conventional case without concavo-convex. The sample was placed in an HVPE apparatus for growing, thereby affording a GaN crystal having a total film thickness of 200 μm.

In the same manner as in Example 12, the sapphire substrate was removed by abrasion to give a GaN crystal. After the growth, the pits in the surface were evaluated. As a result, the pits decreased to $8 \times 10^5$ $cm^{-2}$. By repeating this Example, it was confirmed that a high quality GaN crystal having a low dislocation could be obtained.

INDUSTRIAL APPLICABILITY

According to the semiconductor base and the manufacturing method therefor of the present invention as described above, by forming a convex part on a substrate, lateral growth capable of forming a low dislocation region on a part other than a mask layer, can be achieved. Therefore, problems caused by formation of a mask layer can be solved, such as occurrence of new defects in the junction part of the part formed by lateral growth, due to the micro tilting of the axis, autodoping problem, unattainable selective growth of Al-containing semiconductor materials and the like. After forming a concavo-convex surface on a substrate, moreover, the growth of a buffer layer to the growth of a semiconductor crystal layer, such as light emitting part etc., can be achieved sequentially by a single cycle of growth, which advantageously simplifies the production process.

Combined with improved reflectivity by the use of cavity and a phenomenon of a residual strain and the like, the present invention is highly valuable for the improvement of properties and low costs. Particularly, when the bottom of the concave part is covered with a mask, the growth in the concave part can be suppressed, thereby increasing the efficiency of lateral growth.

According to the manufacturing method of the semiconductor crystal of the present invention, a semiconductor crystal layer having a large area can be realized by the effect of suppression of the residual strain and the like, because the contact area between the substrate and the crystal growth layer is small. Therefore, the present invention achieves growth of a large area, which is not affordable by conventional growth or thick film growth by ELO forming a mask layer. In addition, it solves the problems of occurrence of new defects in the junction part of the part formed by lateral growth, due to the micro tilting of the axis, and autodoping problem. The present invention provides extremely useful effects of a semiconductor crystal having a large area, improvement of properties and low costs.

This application is based on patent application Nos. 072133/1999, 335591/1999, 336421/1999 and 353044/1999 filed in Japan, the contents of which are hereby incorporated by reference.

What is claimed is:

1. A method for manufacturing a semiconductor base comprising a substrate and a GaN group semiconductor crystal defined by $Al_xGa_{1-x-y}In_yN$ wherein $0 \leq x \leq 1$ and $0 \leq y \leq 1$, which is formed on the substrate by vapor phase growth, which method comprises:
   (a) preparing the substrate for crystal growth, wherein the substrate is made of sapphire (C-plane, A-plane, R-plane), SiC (6H, 4H, 3C), Si, Spinel, ZnO, GaAs, or NGO, and a crystal growth plane of the substrate is a plane having concave parts with a bottom surface formed by etching the original substrate, which consequently contains concaves and convexes formed by the concave parts and the remaining convex parts, and wherein the convex parts are of an interspersing island type, and
   (b) growing the GaN group semiconductor crystal from an upper part of the convex parts and from the bottom surface of the concave parts, respectively, such that the crystals grown laterally from the upper part of the convex parts and the crystals grown from the bottom surface of the concave parts are joined to cover the crystal growth plane of the substrate.

2. The method of claim 1, wherein the GaN group semiconductor crystal is grown to fill the concave parts with the crystal.

3. The method of claim 1, wherein not more than 50% of the crystal growth plane is an area occupied by the convex parts.

4. The method of claim 1, wherein the GaN group semiconductor crystal is grown on the crystal growth plane via a buffer layer.

5. The method of claim 1, wherein the GaN group semiconductor crystal is a GaN crystal.

6. A method for manufacturing a semiconductor base comprising a sapphire substrate and a GaN crystal formed on the substrate by vapor phase growth, which method comprises:
   (a) preparing the sapphire substrate for crystal growth, and a crystal growth plane of the substrate is a plane having concave parts with a bottom surface formed by etching the original substrate, which consequently contains concaves and convexes formed by the concave parts and the remaining convex parts, and wherein the convex parts are of an interspersing island type, and
   (b) growing, on the substrate via a buffer layer, the GaN crystal from an upper part of the convex parts and from the bottom surface of the concave parts, respectively, such that the crystals grown laterally from the upper part of the convex parts and the crystal grown from the bottom surface of the concave parts are joined to cover the crystal growth plane of the substrate.

7. The method of claim 6, wherein the buffer layer is a GaN low temperature buffer layer.

8. A method for manufacturing a semiconductor base comprising a substrate and a GaN group semiconductor crystal defined by $Al_xGa_{1-x-y}In_yN$ wherein $0 \leq x \leq 1$ and $0 \leq y \leq 1$, which is formed on the substrate by vapor phase growth, which method comprises (a) preparing a substrate for crystal growth, wherein the substrate is made of sapphire (C-plane, A-plane, R-plane), SiC (6H, 4H, 3C), Si, Spinel, ZnO, GaAs, or NGO, and a crystal growth plane of the substrate is a plane having concave parts with a bottom surface formed by etching the original substrate, which consequently contains concaves and convexes formed by the concave parts and the remaining convex parts, wherein the convex parts are of a lattice type, and (b) growing the GaN group semiconductor crystal from an upper part of the convex parts and from the bottom surface of the concave parts, respectively, such that the crystals grown laterally from the upper part of the convex parts and the crystals grown from the bottom surface of the concave parts are joined to cover the crystal growth plane of the substrate.

* * * * *